(12) United States Patent
Delmas et al.

(10) Patent No.: US 10,643,867 B2
(45) Date of Patent: May 5, 2020

(54) ANNEALING SYSTEM AND METHOD

(71) Applicant: Applied Materials, Inc., Santa Clara, CA (US)

(72) Inventors: Jean Delmas, Santa Clara, CA (US); Charles T. Carlson, Cedar Park, TX (US); Robert Brent Vopat, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/170,683

(22) Filed: Oct. 25, 2018

(65) Prior Publication Data

US 2019/0139793 A1 May 9, 2019

Related U.S. Application Data

(60) Provisional application No. 62/639,800, filed on Mar. 7, 2018, provisional application No. 62/581,532, filed on Nov. 3, 2017.

(51) Int. Cl.
*H01L 21/67* (2006.01)
*F22G 7/00* (2006.01)
*H01L 21/324* (2006.01)

(52) U.S. Cl.
CPC .......... *H01L 21/67109* (2013.01); *F22G 7/00* (2013.01); *H01L 21/324* (2013.01); *H01L 21/67017* (2013.01)

(58) Field of Classification Search
CPC .............. H01L 21/324; H01L 21/6017; H01L 21/67109; H01L 31/0725; H01L 21/67017; H01L 21/67019; F22G 1/16; F22G 1/12; F22G 5/20; F22G 5/12; F22G 5/18; F22G 7/00
See application file for complete search history.

(56) References Cited

U.S. PATENT DOCUMENTS

| 4,524,587 A | 6/1985 | Kantor |
| 5,050,540 A * | 9/1991 | Lindberg ............... F22D 11/006 122/4 R |
| 5,114,513 A | 5/1992 | Hosokawa et al. |
| 5,149,378 A | 9/1992 | Ohmi et al. |

(Continued)

FOREIGN PATENT DOCUMENTS

| CN | 101871043 A | 10/2010 |
| CN | 104047676 A | 9/2014 |

(Continued)

OTHER PUBLICATIONS

Translation of "Damage recovery method of low dielectric constant type silica film", Yoshinori, E.., et al. (JP 2009-129927 A) (Jun. 11, 2009). (Year: 2009).*

(Continued)

*Primary Examiner* — Caridad Everhart
(74) *Attorney, Agent, or Firm* — Patterson + Sheridan LLP

(57) ABSTRACT

A system for annealing substrates is provided. The system includes a first boiler having an input coupled to a water source; a second boiler having an input connected to an output of the first boiler; and a batch processing chamber coupled to the output of the second boiler, wherein the batch processing chamber is configured to anneal a plurality of substrates using steam from the second boiler.

18 Claims, 2 Drawing Sheets

(56) References Cited

U.S. PATENT DOCUMENTS

| | | | |
|---|---|---|---|
| 5,175,123 A | 12/1992 | Vasquez et al. | |
| 5,319,212 A | 6/1994 | Tokoro | |
| 5,590,695 A | 1/1997 | Siegele et al. | |
| 5,620,524 A | 4/1997 | Fan et al. | |
| 5,858,051 A | 1/1999 | Komiyama et al. | |
| 5,879,756 A | 3/1999 | Fathi et al. | |
| 5,880,041 A | 3/1999 | Ong | |
| 5,940,985 A | 8/1999 | Kamikawa et al. | |
| 6,082,950 A | 7/2000 | Altwood et al. | |
| 6,136,664 A * | 10/2000 | Economikos | H01L 21/76227 438/431 |
| 6,150,286 A | 11/2000 | Sun et al. | |
| 6,242,368 B1 | 6/2001 | Holmer et al. | |
| 6,251,751 B1 | 6/2001 | Chu et al. | |
| 6,299,753 B1 | 10/2001 | Chao et al. | |
| 6,319,766 B1 | 11/2001 | Bakli et al. | |
| 6,334,266 B1 | 1/2002 | Moritz et al. | |
| 6,368,412 B1 | 4/2002 | Gomi | |
| 6,442,980 B2 | 9/2002 | Preston et al. | |
| 6,500,603 B1 | 12/2002 | Shioda | |
| 6,583,497 B2 | 6/2003 | Xia et al. | |
| 6,619,304 B2 | 9/2003 | Worm | |
| 6,797,336 B2 | 9/2004 | Garvey et al. | |
| 7,055,333 B2 | 6/2006 | Leitch et al. | |
| 7,111,630 B2 | 9/2006 | Mizobata et al. | |
| 7,114,517 B2 | 10/2006 | Sund et al. | |
| 7,282,458 B2 | 10/2007 | Gates et al. | |
| 7,361,231 B2 | 4/2008 | Fury et al. | |
| 7,460,760 B2 | 12/2008 | Cho et al. | |
| 7,491,658 B2 | 2/2009 | Nguyen et al. | |
| 7,503,334 B1 | 3/2009 | Shrinivasan et al. | |
| 7,521,089 B2 | 4/2009 | Hillman et al. | |
| 7,521,378 B2 | 4/2009 | Fucsko et al. | |
| 7,541,297 B2 | 6/2009 | Mallick et al. | |
| 7,576,441 B2 | 8/2009 | Yin et al. | |
| 7,651,959 B2 | 1/2010 | Fukazawa et al. | |
| 7,655,532 B1 | 2/2010 | Chen et al. | |
| 7,825,038 B2 | 11/2010 | Ingle et al. | |
| 7,825,042 B2 | 11/2010 | Mandal | |
| 7,867,923 B2 | 1/2011 | Mallick et al. | |
| 7,891,228 B2 | 2/2011 | Ding et al. | |
| 8,027,089 B2 | 9/2011 | Hayashi | |
| 8,318,584 B2 | 11/2012 | Li et al. | |
| 8,349,085 B2 | 1/2013 | Tahara et al. | |
| 8,449,942 B2 | 5/2013 | Li et al. | |
| 8,466,073 B2 | 6/2013 | Wang et al. | |
| 8,481,123 B2 | 7/2013 | Kim et al. | |
| 8,536,065 B2 | 9/2013 | Seamons et al. | |
| 8,557,712 B1 | 10/2013 | Antonelli et al. | |
| 8,563,445 B2 | 10/2013 | Liang et al. | |
| 8,647,992 B2 | 2/2014 | Liang et al. | |
| 8,741,788 B2 | 6/2014 | Liang et al. | |
| 8,871,656 B2 | 10/2014 | Mallick et al. | |
| 8,906,761 B2 | 12/2014 | Kim et al. | |
| 8,936,834 B2 | 1/2015 | Kim et al. | |
| 9,121,515 B2 | 9/2015 | Yamamoto et al. | |
| 9,153,442 B2 | 10/2015 | Wang et al. | |
| 9,157,730 B2 | 10/2015 | Rajagopalan et al. | |
| 9,257,314 B1 | 2/2016 | Rivera et al. | |
| 9,306,026 B2 | 4/2016 | Toriumi et al. | |
| 9,362,107 B2 | 6/2016 | Thadani et al. | |
| 9,484,406 B1 | 11/2016 | Sun et al. | |
| 9,570,551 B1 | 2/2017 | Balakrishnan et al. | |
| 10,083,834 B2 | 9/2018 | Thompson et al. | |
| 2001/0029108 A1 | 10/2001 | Tometsuka | |
| 2001/0041122 A1 | 11/2001 | Kroeker | |
| 2001/0050096 A1 | 12/2001 | Costantini et al. | |
| 2002/0073922 A1 | 6/2002 | Frankel et al. | |
| 2002/0122885 A1 | 9/2002 | Ahn | |
| 2002/0148492 A1 | 10/2002 | Yamagata et al. | |
| 2002/0151128 A1 | 10/2002 | Lane et al. | |
| 2003/0030945 A1 | 2/2003 | Heinonen et al. | |
| 2003/0101938 A1 | 6/2003 | Ronsse et al. | |
| 2003/0148035 A1 | 8/2003 | Lingampalli | |
| 2003/0207593 A1 | 11/2003 | Derderian et al. | |
| 2004/0025908 A1 | 2/2004 | Douglas et al. | |
| 2004/0060519 A1 | 4/2004 | Beauchaine et al. | |
| 2004/0112409 A1 | 6/2004 | Schilling | |
| 2004/0219800 A1 | 11/2004 | Tognetti | |
| 2004/0248392 A1 | 12/2004 | Narwankar et al. | |
| 2005/0003655 A1 | 1/2005 | Cathey et al. | |
| 2005/0051194 A1 | 3/2005 | Sakashita et al. | |
| 2005/0136684 A1 | 6/2005 | Mukai et al. | |
| 2005/0191828 A1 | 9/2005 | Al-Bayati et al. | |
| 2005/0198971 A1 | 9/2005 | Leitch et al. | |
| 2005/0250347 A1 | 11/2005 | Bailey et al. | |
| 2005/0269291 A1 | 12/2005 | Kent | |
| 2006/0124613 A1 | 6/2006 | Kumar et al. | |
| 2006/0207633 A1 | 9/2006 | Kim et al. | |
| 2006/0226117 A1 | 10/2006 | Bertram et al. | |
| 2006/0279025 A1 | 12/2006 | Heidari et al. | |
| 2006/0290017 A1 | 12/2006 | Yanagisawa | |
| 2007/0012402 A1 | 1/2007 | Sneh | |
| 2007/0187386 A1 | 8/2007 | Kim et al. | |
| 2007/0204797 A1 | 9/2007 | Fischer | |
| 2007/0212850 A1 | 9/2007 | Ingle et al. | |
| 2007/0243317 A1 | 10/2007 | Du Bois et al. | |
| 2007/0256559 A1 * | 11/2007 | Chen | B01D 53/1425 95/169 |
| 2008/0074658 A1 | 3/2008 | Davis et al. | |
| 2008/0115726 A1 | 5/2008 | Ingle et al. | |
| 2008/0210273 A1 | 9/2008 | Joe | |
| 2009/0081884 A1 | 3/2009 | Yokota et al. | |
| 2009/0148965 A1 | 6/2009 | Kim et al. | |
| 2009/0180847 A1 | 7/2009 | Guo et al. | |
| 2009/0186481 A1 | 7/2009 | Suzuki et al. | |
| 2009/0233449 A1 | 9/2009 | Lebouitz et al. | |
| 2009/0243126 A1 | 10/2009 | Washiya et al. | |
| 2010/0006211 A1 | 1/2010 | Wolk et al. | |
| 2010/0012292 A1 | 1/2010 | Yamazaki | |
| 2010/0173495 A1 | 7/2010 | Thakur et al. | |
| 2010/0304027 A1 | 12/2010 | Lee et al. | |
| 2010/0320459 A1 | 12/2010 | Umeda et al. | |
| 2010/0327422 A1 | 12/2010 | Lee et al. | |
| 2011/0151677 A1 | 6/2011 | Wang et al. | |
| 2011/0165781 A1 | 7/2011 | Liang et al. | |
| 2011/0198736 A1 | 8/2011 | Shero et al. | |
| 2012/0048304 A1 | 3/2012 | Kitajima et al. | |
| 2012/0056173 A1 | 3/2012 | Pieralisi | |
| 2012/0060868 A1 | 3/2012 | Gray | |
| 2012/0142192 A1 | 6/2012 | Li et al. | |
| 2012/0175822 A1 | 7/2012 | Inamiya et al. | |
| 2012/0252210 A1 | 10/2012 | Tohnoe | |
| 2012/0285492 A1 | 11/2012 | Lee et al. | |
| 2013/0194350 A1 | 8/2013 | Watanabe et al. | |
| 2013/0233170 A1 * | 9/2013 | Spiegelman | B01D 71/36 95/23 |
| 2013/0330042 A1 | 12/2013 | Nara et al. | |
| 2013/0337171 A1 | 12/2013 | Sasagawa | |
| 2014/0023320 A1 | 1/2014 | Lee et al. | |
| 2014/0045300 A1 | 2/2014 | Chen et al. | |
| 2014/0076494 A1 | 3/2014 | Miyashita et al. | |
| 2014/0134827 A1 | 5/2014 | Swaminathan et al. | |
| 2014/0138802 A1 | 5/2014 | Starostine et al. | |
| 2014/0183743 A1 | 7/2014 | Matsumoto et al. | |
| 2014/0231384 A1 | 8/2014 | Underwood et al. | |
| 2014/0235068 A1 | 8/2014 | Ashihara et al. | |
| 2014/0239291 A1 | 8/2014 | Son et al. | |
| 2014/0264237 A1 | 9/2014 | Chen et al. | |
| 2014/0284821 A1 | 9/2014 | Hubbard | |
| 2014/0322921 A1 | 10/2014 | Ahmad et al. | |
| 2015/0000870 A1 | 1/2015 | Hosotani et al. | |
| 2015/0050807 A1 | 2/2015 | Wu et al. | |
| 2015/0056819 A1 | 2/2015 | Wong et al. | |
| 2015/0091009 A1 | 4/2015 | Yamazaki et al. | |
| 2015/0159272 A1 | 6/2015 | Yoon et al. | |
| 2015/0179501 A1 | 6/2015 | Jhaveri et al. | |
| 2015/0255581 A1 | 9/2015 | Lin et al. | |
| 2015/0292736 A1 | 10/2015 | Hirson et al. | |
| 2015/0309073 A1 | 10/2015 | Mirkin et al. | |
| 2015/0322286 A1 | 11/2015 | Cabrini et al. | |
| 2015/0364348 A1 | 12/2015 | Park et al. | |
| 2016/0027887 A1 | 1/2016 | Yuan et al. | |
| 2016/0035600 A1 | 2/2016 | Rivera et al. | |

(56) References Cited

U.S. PATENT DOCUMENTS

| | | |
|---|---|---|
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1* | 9/2016 | Fujimura ............... H05B 6/108 |
| 2016/0274454 A1 | 9/2016 | Beasley et al. |
| 2016/0334162 A1 | 11/2016 | Kim et al. |
| 2016/0353522 A1 | 12/2016 | Rathi et al. |
| 2017/0005204 A1 | 1/2017 | Hosoba et al. |
| 2017/0011932 A1 | 1/2017 | Pethe et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0261480 A1 | 9/2018 | Liang et al. |

FOREIGN PATENT DOCUMENTS

| | | |
|---|---|---|
| CN | 104089491 A | 10/2014 |
| JP | S63-004616 | 1/1988 |
| JP | H06-283496 | 10/1994 |
| JP | H07048489 B2 | 5/1995 |
| JP | 2004127958 A | 4/2004 |
| JP | 2005064269 A | 3/2005 |
| JP | 2005-333015 A | 12/2005 |
| JP | 2007242791 A | 9/2007 |
| JP | 2009-129927 | 6/2009 |
| JP | 2010-205854 A | 9/2010 |
| JP | 2012-503883 A | 2/2012 |
| JP | 2012-204656 A | 10/2012 |
| JP | 2013516788 A | 5/2013 |
| JP | 2014019912 A | 2/2014 |
| KR | 20070075383 A | 7/2007 |
| KR | 20090011463 A | 2/2009 |
| KR | 1020090040867 A | 4/2009 |
| KR | 10-1287035 | 7/2013 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |
| WO | 2008/089178 A2 | 7/2008 |
| WO | 2011/103062 A2 | 8/2011 |
| WO | 2012/133583 A1 | 10/2012 |
| WO | 2016065219 A1 | 4/2016 |

OTHER PUBLICATIONS

Translation of "Boiler System of Providing Dry Steam for Renewed Pipe", Lee, K. (KR 101287035 B1) (Jul. 18, 2013). (Year: 2013).*
Translation of "Steam Treating Unit"m Mizogami, K. (JP 63-004616 A), (Jan. 9, 1988). (Year: 1988).*
Taiwan Office Action dated Jun. 14, 2019 for Application No. 107138905.
International Search Report and Written Opinion for PCT/US2018/021715 dated Jun. 22, 2018.
International Search Report and Written Opinion from PCT/US2018/034036 (APPM/25104PC) dated Aug. 24, 2018.
International Search Report and Written Opinion dated Aug. 24, 2018 for Application No. PCT/US2018/034284 (APPM/025105PC).
International Search Report, Application No. PCT/US2018/028258 (APPM/25170PC) dated Aug. 9, 2018.
International Search Report and Written Opinion for PCT/US2018/035210 (APPM/25236PC) dated Aug. 24, 2018.
International Search Report and Written Opinion for PCT/US2018/037539 (APPM/24939PC) dated Oct. 5, 2018.
International Search Report and Written Opinion for PCT/US2018/038822 (APPM/24681PC) dated Oct. 26, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688 (APPM/25059WO01).
International Search Report and Written Opinion for PCT/US2018/043160 dated Jan. 31, 2019.
International Search Report and Written Opinion dated Jan. 31, 2019 for Application No. PCT/US2018/042760 (APPM/25102PC).
Office Action for Japanese Application No. 2018-546484 (APPM/023712JP01) dated Oct. 8, 2019.
International Search Report and Written Opinion for International Application No. PCT/US2019/040195 (APPM/44015662WO01) dated Oct. 25, 2019.
International Search Report and Written Opinion for PCT/US2018/021715 (APPM/24892WO) dated Jun. 22, 2018.
International Search Report and Written Opinion for PCT/US2018/059643 (APPM/25301PC) dated Feb. 26, 2019.
International Search Report and Written Opinion from PCT/US2019/012161 dated Apr. 30, 2019 (APPM/25703US).
International Search Report and Written Opinion for PCT/US2019/015339 (APPM/44014994PC) dated May 15, 2019.
International Search Report and Written Opinion for PCT/US2019/015332 (APPM/44014895PC) dated May 15, 2019.
International Search Report and Written Opinion for PCT/US2018/059676 (APPM/25833PC) dated May 23, 2019.
International Search Report and Written Opinion for PCT/US2019/023431 (APPM/44015232PC) dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136151 (APPM/025417TW01).
International Search Report and Written Opinion for International Application No. PCT/US2019/029602 (APPM/44015258WO01) dated Aug. 14, 2019.
Korean Office Action dated Feb. 4, 2020 for Application No. (PCT) 10-2018-0133399.

* cited by examiner

ANNEALING SYSTEM AND METHOD

CROSS-REFERENCE TO RELATED APPLICATIONS

This application claims benefit of U.S. provisional patent application Ser. No. 62/581,532, filed Nov. 3, 2017, and U.S. provisional patent application Ser. No. 62/639,800, filed Mar. 7, 2018, which are both hereby incorporated herein by reference.

BACKGROUND

Field

Embodiments of the disclosure generally relate to fabrication of integrated circuits and particularly to an apparatus and method for annealing one or more semiconductor substrates.

Description of the Related Art

Formation of a semiconductor device, such as memory devices, logic devices, microprocessors etc. involves deposition of one or more films over a semiconductor substrate. The films are used to create the circuitry required to manufacture the semiconductor device. Annealing is a heat treatment process used to achieve various effects on the deposited films to improve their electrical properties. For example, annealing can be used to activate dopants, densify the deposited films, or change states of grown films.

Semiconductor device geometries have dramatically decreased in size since their introduction several decades ago. Increasing device densities have resulted in structural features having decreased spatial dimensions. For example, the aspect ratio (ratio of depth to width) of gaps and trenches forming the structural features of modern semiconductor devices have narrowed to a point where filling the gap with material has become extremely challenging.

Thus, there is a need for an improved apparatus and method for annealing semiconductor substrates that can accommodate the challenges associated with manufacturing modern semiconductor devices.

SUMMARY OF THE INVENTION

Embodiments of the present disclosure generally relate to a system and method for annealing one or more semiconductor substrates. In one embodiment, a system for annealing substrates is provided. The system includes a first boiler having an input coupled to a water source; a second boiler having an input connected to an output of the first boiler; and a batch processing chamber coupled to the output of the second boiler, wherein the batch processing chamber is configured to anneal a plurality of substrates using steam from the second boiler.

In another embodiment, a method of annealing substrates in a processing chamber is provided. The method includes loading one or more substrates into an internal volume of the processing chamber; receiving water in a first boiler; generating saturated steam from the received water in the first boiler; supplying the steam generated in the first boiler to a second boiler; generating superheated steam in the second boiler; supplying the superheated steam from the second boiler to a processing chamber; and annealing the substrates in the processing chamber with the superheated steam from the second boiler.

In another embodiment, a method of annealing substrates in a processing chamber is provided. The method includes loading one or more substrates into an internal volume of the processing chamber; receiving water in a first boiler, wherein the water received in the first boiler has an oxygen concentration of less than 5 ppb; generating saturated steam from the received water in the first boiler; supplying the steam generated in the first boiler to a second boiler; generating superheated steam in the second boiler; supplying the superheated steam from the second boiler to a processing chamber; filtering the steam between the output of the second boiler and the input of the batch processing chamber; and annealing the substrates in the processing chamber with the superheated steam from the second boiler at a temperature from about 450° C. to about 550° C. and a pressure from about 40 barG to about 110 barG.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

Figure 1:
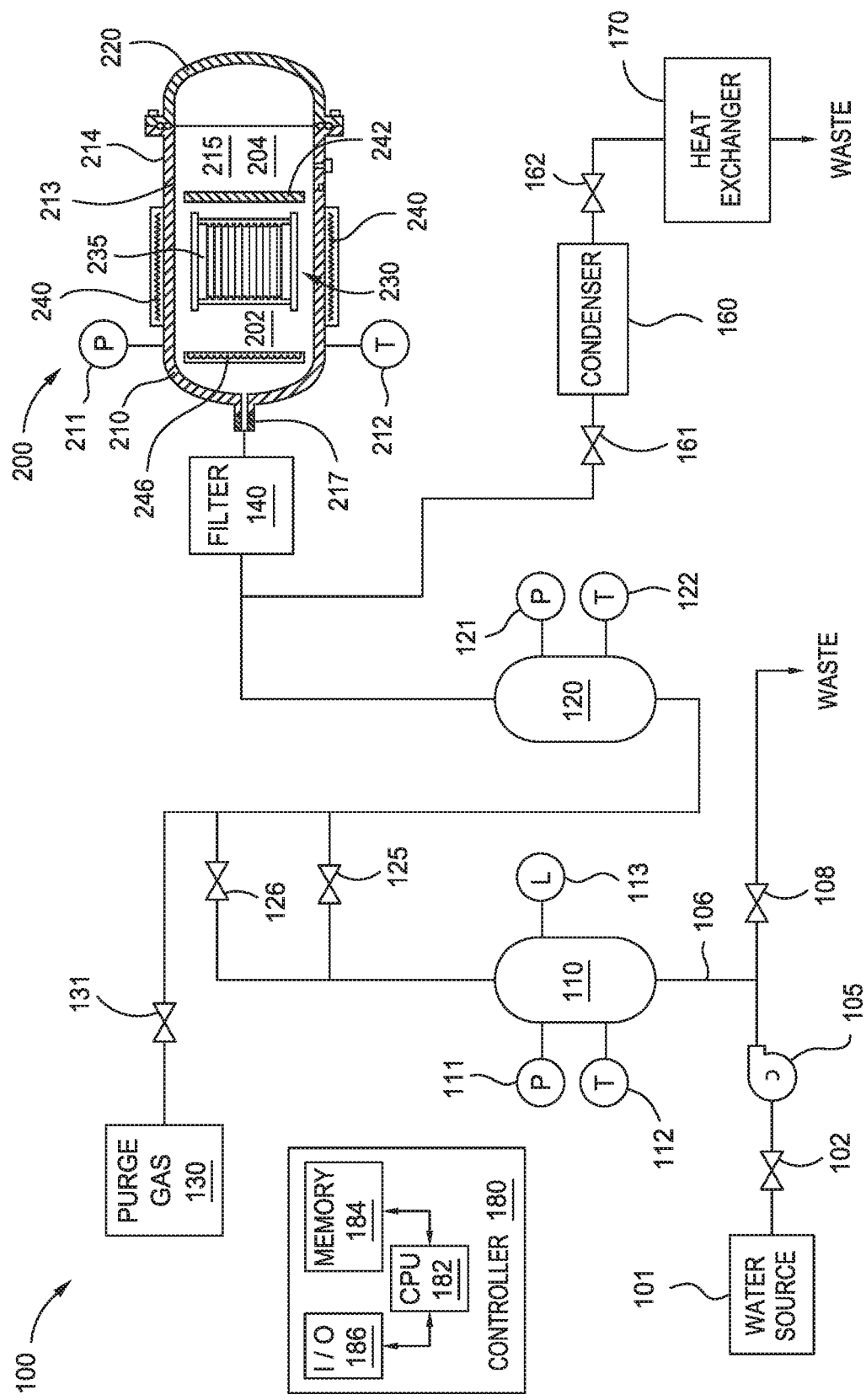
FIG. 1 is an overview of a steam annealing system for annealing one or more semiconductor substrates, according to one embodiment.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Embodiments of the disclosure relate to an apparatus and method for annealing one or more semiconductor substrates.

FIG. 1 is an overview of a steam annealing system 100 for annealing one or more semiconductor substrates, according to one embodiment. The steam annealing system 100 includes a first boiler 110, a second boiler 120, and a batch processing chamber 200. The first boiler 110 can be used to produce saturated steam. The second boiler 120 can receive the steam generated from the first boiler 110 and can be used to produce superheated steam. The superheated steam generated by the second boiler 120 can be supplied to the batch processing chamber 200 for annealing the substrates.

The steam annealing system 100 can further include a water source 101, a water supply valve 102, process lines 106, and a supply pump 105. In some embodiments, the water source 101 can supply deionized water with an oxygen concentration less than 5 ppb for generating the steam in the steam annealing system 100. Using water with low concentrations of oxygen, such as less than 5 ppb, helps reduce oxidation of surfaces in the steam annealing system 100, such as internal surfaces of the boilers 110, 120, the batch processing chamber 200, as well as the pump 105, the process lines 106, and valves, such as water supply valve 102. Reducing oxidation in the steam annealing system 100 helps prevent the formation of particles caused by oxidation, which can damage the substrates being processed in the batch processing chamber 200 and/or lower product quality of those substrates. The pump 105 can supply pressurized water from the water source 101 to the first boiler 110 when the water supply valve 102 is open. In some embodiments, the pump 105 continues to run during the annealing of the substrates to assist in maintaining pressure in the first boiler 110. The steam annealing system 100 can further include a waste valve 108 for draining the steam annealing system 100 of water or when purging the steam annealing system 100 using an inert gas as described below.

The process lines 106 connect the different components (e.g., pump, valves, boilers, etc.) together in the steam annealing system 100. In some embodiments, the process lines 106 and other components in the steam annealing system 100 can be made from or covered with nickel-based steel alloys that exhibit high resistance to corrosion, such as but not limited to HASTELLOY®, ICONEL®, and MONEL.

The first boiler 110 is used to produce saturated steam at pressures up to 200 barG. For example, the first boiler 110 can be used to produce saturated steam at 311° C. and 100 barG. The first boiler 110 includes a pressure sensor 111 and a temperature sensor 112 that can be used to control the pressure and temperature within the first boiler 110. The first boiler 110 can further include a level sensor 113. The level sensor 113 can be used to ensure the first boiler 110 never runs dry in an effort to reduce particle generation from the first boiler 110.

The saturated steam produced by the first boiler 110 can be supplied to the second boiler 120 for producing superheated steam by the second boiler 120. The second boiler 120 includes a pressure sensor 121 and a temperature sensor 122 that can be used to control the pressure and temperature within the second boiler 120. The steam annealing system 100 further includes a high flow valve 125 and a low flow valve 126 arranged in parallel between the output of the first boiler 110 and the input of the second boiler 120. The high flow valve 125 can be used to more quickly fill the steam annealing system 100 downstream of the first boiler 110 with steam or when a purge of the second boiler 120 and the batch processing chamber 200 using an inert gas is being executed. The low flow valve 126 can be used for slower filling of the steam annealing system 100 downstream of the first boiler 110 with steam and when controlling the temperature and pressure in the batch processing chamber 200 when the substrates are being annealed. In one embodiment, the high flow valve 125 is configured to allow a flow of steam from about two times greater to about 50 times greater than the low flow valve 126, such as about 10 times greater than the low flow valve 126.

The steam annealing system 100 can further include a filter 140 position between the output of the second boiler 120 and the batch processing chamber 200. The filter 140 can help prevent particles from being injected into the batch processing chamber 200.

The batch processing chamber 200 can include a port 217 for receiving superheated steam from the second boiler 120 during processing. For example, the batch processing chamber 200 can receive superheated steam at temperatures from about 300° C. to about 600° C., such as from about 450° C. to about 550° C., at pressures from about 10 barG to about 200 barG, such as from about 40 barG to about 110 barG.

The batch processing chamber 200 has a body 210 with an outer surface 214 and an inner surface 213 that encloses an internal volume 215. In some embodiments such as in FIG. 1, the body 210 has an annular cross section, though in other embodiments the cross-section of the body 210 may be rectangular or any closed shape. The outer surface 214 of the body 210 may be made from a corrosion resistant steel (CRS), such as but not limited to stainless steel. The outer surface 214 may be optionally covered with a layer of thermal insulation that prevents loss of heat from the batch processing chamber 200 into the outside environment. The inner surface 213 of the body 210 may be made from or covered with nickel-based steel alloys that exhibit high resistance to corrosion, such as but not limited to HASTELLOY®, ICONEL®, and MONEL®. Optionally, the body 210 may be fabricated from a nickel-based steel alloy.

The batch processing chamber 200 includes a door 220 configured to sealably enclose the internal volume 215 within the body 210 such that substrates 235 may be transferred in and out of the internal volume 215 when the door 220 is open. The substrates 235 can be placed in a cassette 230 positioned within the body 210 of the batch processing chamber 200. The cassette 230 can be coupled to an actuator (not shown) that can be moved in and out of the internal volume 215 of the batch processing chamber 200. The cassette 230 may have as many as fifty substrate storage slots for holding the substrates 235. The cassette 230 provides an effective vehicle both for transferring a plurality of substrates 235 into and out of the batch processing chamber 200 and for processing the plurality of substrates 235 in the internal volume 215.

An anti-convection panel 242 may be placed between the door 220 and the cassette 230. The anti-convection panel 242 separates the internal volume 215 into a hot processing region 202 in which the cassette 230 resides and a cooler region 204 proximate the door 220. The anti-convection panel 242 is generally a metal plate fabricated from the same materials as the chamber body 210.

One or more heaters 240 are disposed on the body 210 and are configured to heat the body 210 of the batch processing chamber 200. In some embodiments, the heaters 240 are disposed on the outer surface 214 of the body 210 as shown in FIG. 1. Furthermore, one or more heaters 246 are disposed in the body 210 and configured to heat the substrates 235 disposed in the cassette 230 while in the internal volume 215 of the batch processing chamber 200. The one or more heaters 246 are controlled by a controller 180 through feedback received from a temperature sensor 212. The temperature sensor 212 may be disposed in the body 210 to monitor the temperature of the internal volume 215. In one example, the heaters 246 are operable to maintain a the substrates 235 disposed in the cassette 230 while in the hot processing region 202 of the internal volume 215 of the batch processing chamber 200 at a temperature from about 300° C. to about 600° C., such as from about 450° C. to about 550° C.

The steam annealing system 100 further includes a condenser 160, a condenser inlet valve 161 and a condenser outlet valve 162. The condenser 160 is fluidly coupled to a cooling fluid source (not shown) and configured to condense the steam exiting the batch processing chamber 200 and/or from the second boiler 120 into liquid water when the condenser inlet valve 161 and the condenser outlet valve 162 are open.

The steam annealing system 100 can further include a heat exchanger 170. The heat exchanger 170 is configured to further cool the condensed water from the condenser 160, so that the water may be more easily managed. A pump (not shown) can be fluidly connected to the heat exchanger 170 to pump out the liquefied processing fluid from the heat exchanger 170 to a container for recycling, reuse or disposal.

The steam annealing system 100 can further include a purge gas source 130 and a purge gas supply valve 131. The purge gas source 130 may supply a pressurized inert gas, such as but not limited to nitrogen or argon, and the like. The purge gas can be supplied to remove residual steam and air from the steam annealing system 100. The purge gas can be supplied on initial use of the steam annealing system 100 to remove any residual oxygen from the system to help prevent oxidation that can occur within the piping, valves, boilers, batch processing chamber, or other equipment within the steam annealing system 100. The purge gas source 130 can purge the first boiler 110 when the high flow valve 125 and/or low flow valve 126 are open along with the waste valve 108 and the purge gas supply valve 131. The purge gas source 130 can purge the second boiler 120 when the condenser inlet valve 161 and the condenser outlet valve 162 are opened along with the purge gas supply valve 131. In some embodiments, the batch processing chamber 200 can include an inlet port (e.g., inlet port 217) and an outlet port (not shown) to assist in purging the batch processing chamber 200. The condenser inlet valve 161 can be connected to this outlet valve (not shown) so that all of the purge gas that flows through the second boiler 120 also flows through the batch processing chamber 200.

The steam annealing system 100 can further include the controller 180 introduced above to control and monitor the equipment in the steam annealing system 100. The controller 180 includes a central processing unit (CPU) 182, a memory 184, and a support circuit 186. The CPU 182 may be any form of a general-purpose computer processor that may be used in an industrial setting. The memory 184 may be a random-access memory, a read-only memory, a floppy, or a hard disk drive, or other form of digital storage. The I/O 186 is conventionally coupled to the CPU 182 and may include cache, clock circuits, support circuits, power supplies, and the like.

The controller 180 can control and monitor the operation of various components of the steam annealing system 100. For example, the controller 180 can control and monitor the operation of the pump 105 and the numerous valves throughout the steam annealing system 100 as well as operation of the boilers 110, 120, the batch processing chamber 200, the condenser 160, and the heat exchanger 170.

Figure 2:
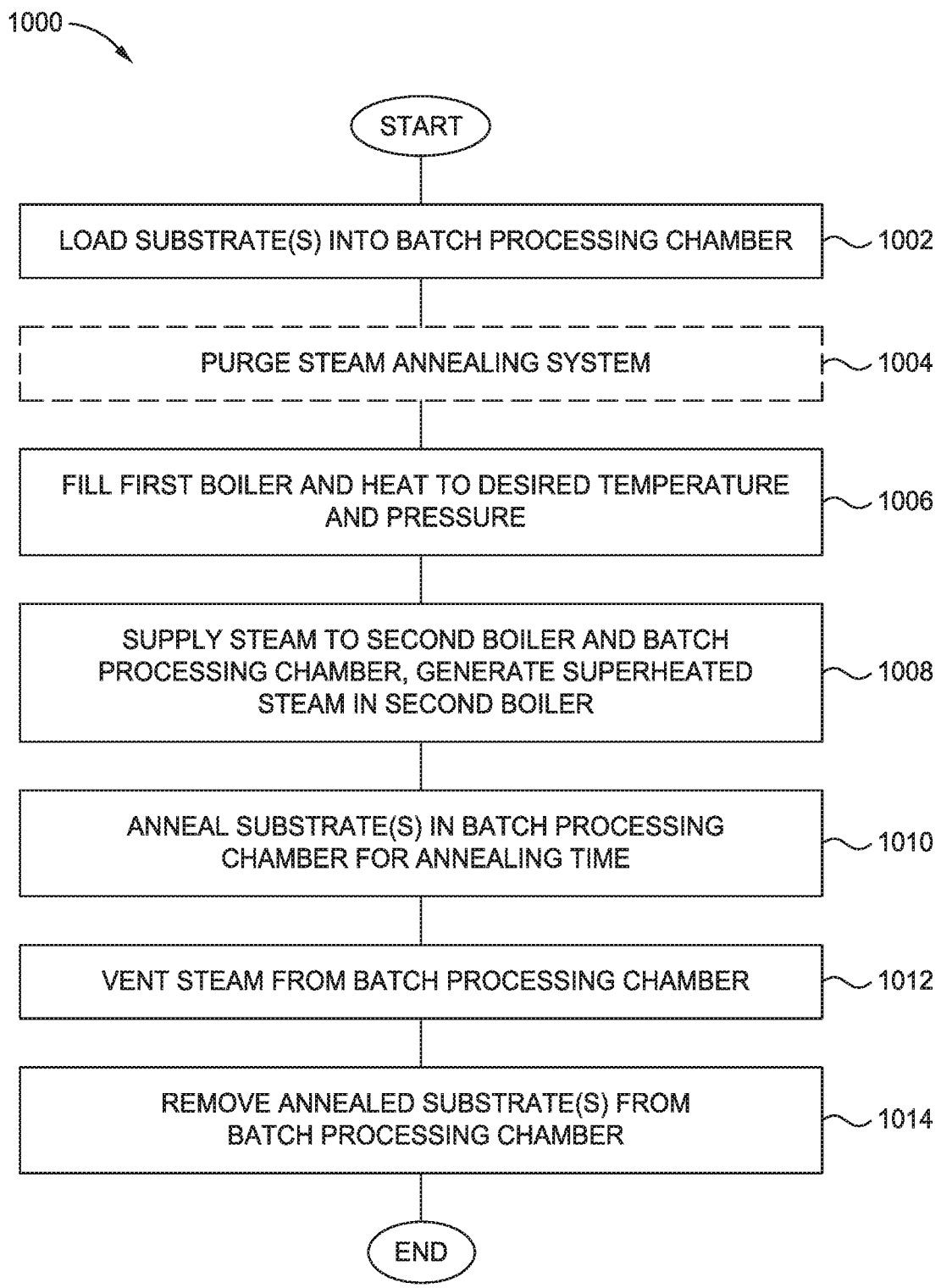
FIG. 2 is a process flow diagram of a method of annealing one or more substrates using the steam annealing system of FIG. 1, according to one embodiment.

FIG. 2 is a process flow diagram of a method 1000 of annealing one or more substrates 235 using the steam annealing system 100 of FIG. 1, according to one embodiment. Referring to FIGS. 1 and 2, the method 1000 is described.

At block 1002, one or more substrates 235 are loaded into the internal volume 215 of the batch processing chamber 200 and the door 220 is closed so that the batch processing chamber 200 can be pressurized. For example, the cassette 230 can be transported into the internal volume 215 by an actuator to load a plurality of substrates 235 into the batch processing chamber 200.

At block 1004, an optional purge of the steam annealing system 100 can be performed. The purge of the steam annealing system 100 can include purging the first boiler 110 and surrounding process lines. To purge the first boiler 110, the purge gas supply valve 131 can be opened along with the high flow valve 125, the low flow valve 126, and the waste valve 108. The purge of the steam annealing system 100 can further include purging the second boiler 120 and surrounding process lines. To purge the second boiler 120, the purge gas supply valve 131 can be opened along with the condenser inlet valve 161 and the condenser outlet valve 162. Purging the boilers 110, 120 and the surrounding process lines can help remove oxygen from the steam annealing system to help prevent oxidation in the boilers and surrounding valves and process lines. In some embodiments, the batch processing chamber 200 includes a first port (e.g., inlet port 217) connected to the output of the second boiler 120 and a second port connected to the condenser inlet valve 161 enabling the batch processing chamber 200 to be purged when the second boiler 120 is purged.

At block 1006, the first boiler 110 is filled with water and heated to a desired pressure and temperature. The water supplied to the first boiler 110 can have an oxygen concentration of less than 5 ppb. The low oxygen content in the water helps reduce oxidation of surfaces within the steam annealing system 100, which helps reduce particle generation that can damage and/or lower the product quality of substrates being annealed in the batch processing chamber 200. Heating the first boiler 110 to a desired pressure and temperature can include supplying heat to the first boiler 110 while keeping the high flow valve 125 and the low flow valve 126 closed allowing the pressure within the first boiler 110 to increase. In one example, the first boiler 110 is heated to produce saturated steam at a pressure of 70 barG. In some embodiments, the pressure of the steam generated at block 1006 is greater than the pressure at which the substrates in the batch processing chamber 200 will be annealed with the steam. For example, in one embodiment, the first boiler 110 is heated to generate steam at a pressure of 70 barG while the substrates 235 are annealed at a pressure of 50 barG.

At block 1008, the steam annealing system 100 supplies steam to the second boiler 120 and the batch processing chamber 200. In one embodiment, the high flow valve 125 can be opened and in some cases also the low flow valve 126 can be opened to supply steam from the first boiler 110 to the second boiler 120. In another embodiment, the low flow valve 126 can be opened to supply steam from the first boiler 110 to the second boiler 120 while keeping the high flow valve 125 closed in order to reduce the pressure drop that occurs in the first boiler 110 when the first boiler 110 begins to supply steam to the second boiler 120 and the batch processing chamber 200. The second boiler 120 can further heat the steam received from the first boiler 110 to generate superheated steam that can be supplied to the batch processing chamber 200. The pressure in the first boiler 110 can drop below the pressure obtained during block 1006 as the steam from the first boiler 110 flows into the second boiler 120 and the batch processing chamber 200. Block 1008 continues until the desired pressure (e.g., 50 barG) and temperature (e.g., 550° C.) in the batch processing chamber 200 are reached. The pressure sensor 211 and the temperature sensor 212 can be used to determine when the desired pressure and temperature in the batch processing chamber 200 are reached.

At block 1010, the one or more substrates 235 are annealed in the batch processing chamber 200 at the pressure and temperature reached at block 1008 for an annealing time. In some embodiments, the annealing time can be from about five minutes to about one hour, such as from about 20 minutes to about 30 minutes. The high flow valve 125 and the low flow valve 126 can be closed during block 1010.

Furthermore, at block 1010, the first boiler 110 and the second boiler 120 can continue to provide heat and maintain pressure. In some embodiments, the low flow valve 126 can be opened if there is a pressure drop in the batch processing chamber 200 allowing the pressure in the batch processing chamber 200 to return to its setpoint. In one such embodiment, the low flow valve 126 can be a pressure regulator, so that the low flow valve 126 automatically opens if the pressure drops on the batch processing chamber 200 side of the low flow valve 126. The heaters 240, 246 of the batch processing chamber 200 can be used to maintain the temperature of the steam in the batch processing chamber 200 at its desired setpoint.

In an alternative embodiment, the valves 125, 126 can remain open during the annealing of the one or more substrates 235 and the pressure in the batch processing chamber 200 can be allowed to equalize or substantially equalize with the pressure in the first boiler 110. For example, the first boiler 110 can be heated to produce saturated steam at a pressure of 50 barG, the second boiler 120 can further heat the steam from the first boiler 110 to produce superheated steam at 50 barG, and then the superheated steam at 50 barG can be provided to the batch processing chamber 200. In this alternative embodiment, the first boiler 110 can be operated to maintain the pressure at 50 barG throughout the annealing.

At block 1012, the steam in the batch processing chamber 200 is vented through the condenser 160 and the heat exchanger 170 after the one or more substrates 235 are annealed for the annealing time. The condenser inlet valve 161 and the condenser outlet valve 162 are opened at block 1012 to allow the steam to flow through the condenser 160 and the heat exchanger 170. Initially, the condenser inlet valve 161 can be opened while keeping the condenser outlet valve 162 closed, so that the pressure in the batch processing chamber 200 and surrounding equipment in the steam annealing system 100 does not drop too quickly, and then when the pressure in the batch processing chamber 200 drops to a determined threshold, the condenser outlet valve 162 can be opened. The high flow valve 125 and the low flow valve 126 can remain closed during the venting of the batch process chamber 200, so that the steam in the first boiler can remain pressurized for annealing the next batch of substrates 235.

At block 1014, the one or more substrates 235 are removed from the batch processing chamber 200. For example, the cassette 230 can be transported out of the internal volume 215 by an actuator to remove a plurality of substrates 235 from the batch processing chamber 200.

While the foregoing is directed to embodiments of the present disclosure, other and further embodiments of the disclosure may be devised without departing from the basic scope thereof, and the scope thereof is determined by the claims that follow.

The invention claimed is:

1. A system for annealing substrates comprising:
   a first boiler having an input coupled to a water source;
   a second boiler having an input connected to an output of the first boiler;
   a batch processing chamber coupled to the output of the second boiler, wherein the batch processing chamber is configured to anneal a plurality of substrates using steam from the second boiler; and
   a high flow valve and a low flow valve arranged in parallel between the output of the first boiler and the input of the second boiler, wherein the high flow valve is configured to allow a flow of steam at least two times higher than the low flow valve.

2. The system of claim 1, wherein the low flow valve is a pressure regulator.

3. The system of claim 1, further comprising a filter disposed between the output of the second boiler and the input of the batch processing chamber.

4. The system of claim 1, wherein the water source is configured to provide water having an oxygen concentration of less than 5 ppb.

5. The system of claim 1, further comprising a purge gas source connected to the first boiler and the second boiler.

6. The system of claim 1, wherein the first boiler is configured to generate saturated steam to supply to the second boiler.

7. The system of claim 6, wherein the second boiler is configured to generate superheated steam to supply to the batch processing chamber.

8. The system of claim 1, further comprising a condenser connected downstream from the output of the second boiler, wherein the condenser is further connected to a port on the batch processing chamber.

9. The system of claim 8, further comprising a heat exchanger connected to an output of the condenser.

10. A method of annealing substrates in a processing chamber, the method comprising:
    loading one or more substrates into an internal volume of the processing chamber;
    receiving water in a first boiler;
    generating saturated steam from the received water in the first boiler;
    supplying the saturated steam generated in the first boiler to a second boiler;
    generating superheated steam in the second boiler;
    supplying the superheated steam from the second boiler to a processing chamber; and
    annealing the substrates in the processing chamber with the superheated steam from the second boiler, wherein a pressure in the processing chamber during the annealing of the substrates is from about 40 barG to about 110 barG.

11. The method of claim 10, wherein the water received in the first boiler has an oxygen concentration of less than 5 ppb.

12. The method of claim 10, further comprising filtering the steam between an output of the second boiler and an input of the processing chamber.

13. The method of claim 10, wherein a temperature in the processing chamber during the annealing of the substrates is from about 450° C. to about 550° C.

14. A method of annealing substrates in a processing chamber, the method comprising:
    loading one or more substrates into an internal volume of the processing chamber;
    receiving water in a first boiler;
    generating saturated steam from the received water in the first boiler;
    supplying the saturated steam generated in the first boiler to a second boiler;
    generating superheated steam in the second boiler, wherein a pressure of the saturated steam is greater than a pressure of the superheated steam and a pressure regulator valve is disposed between the first boiler and the second boiler;
    supplying the superheated steam from the second boiler to a processing chamber; and annealing the substrates in the processing chamber with the superheated steam from the second boiler.

15. A method of annealing substrates in a processing chamber, the method comprising:
    loading one or more substrates into an internal volume of the processing chamber;
    receiving water in a first boiler;
    generating saturated steam from the received water in the first boiler;
    supplying the saturated steam generated in the first boiler to a second boiler;
    generating superheated steam in the second boiler;
    supplying the superheated steam from the second boiler to a processing chamber; and
    annealing the substrates in the processing chamber with the superheated steam from the second boiler, wherein a pressure of the processing chamber during the annealing of the substrates is substantially equal to a pressure of the saturated steam generated in the first boiler.

16. A method of annealing substrates in a processing chamber, the method comprising:
    loading one or more substrates into an internal volume of the processing chamber;
    receiving water in a first boiler;
    generating saturated steam from the received water in the first boiler;
    supplying the saturated steam generated in the first boiler to a second boiler;
    generating superheated steam in the second boiler;
    supplying the superheated steam from the second boiler to a processing chamber;
    annealing the substrates in the processing chamber with the superheated steam from the second boiler; and
    venting the steam from the processing chamber through a condenser after the annealing of the substrates.

17. The method of claim 16, further comprising purging the first boiler and the second boiler with an inert gas before annealing the substrates in the processing chamber.

18. A method of annealing substrates in a processing chamber, the method comprising:
    loading one or more substrates into an internal volume of the processing chamber;
    receiving water in a first boiler, wherein the water received in the first boiler has an oxygen concentration of less than 5 ppb;
    generating saturated steam from the received water in the first boiler;
    supplying the saturated steam generated in the first boiler to a second boiler;
    generating superheated steam in the second boiler;
    supplying the superheated steam from the second boiler to a processing chamber;
    filtering the steam between an output of the second boiler and an input of the processing chamber; and
    annealing the substrates in the processing chamber with the superheated steam from the second boiler at a temperature from about 450° C. to about 550° C. and a pressure from about 40 barG to about 110 barG.

* * * * *